(12) United States Patent
Sun et al.

(10) Patent No.: US 6,410,422 B1
(45) Date of Patent: Jun. 25, 2002

(54) METHOD OF FORMING A LOCAL INTERCONNECT CONTACT OPENING

(75) Inventors: Gow-Wei Sun, Taipei Hsien; Pei-Jen Wang, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/684,476

(22) Filed: Oct. 10, 2000

(30) Foreign Application Priority Data

Sep. 25, 2000 (TW) ........................................ 89119722 A

(51) Int. Cl.[7] ......................................... H01L 21/4763
(52) U.S. Cl. ..................... 438/637; 438/638; 438/672; 438/675; 438/706; 438/736
(58) Field of Search ................. 438/637–640, 438/706, 734, 735, 736, 737, 738, 740, 743–744, 723–725, 714, 711, 672, 675

(56) References Cited

U.S. PATENT DOCUMENTS 6,159,839 A * 12/2000 Jeng et al. ................. 438/618
6,159,862 A * 12/2000 Yamada et al. ............. 438/712

\* cited by examiner

*Primary Examiner*—Tuan H. Nguyen
*Assistant Examiner*—Thanh Nguyen
(74) *Attorney, Agent, or Firm*—Charles C. H. Wu; Wu & Cheung, LLP

(57) ABSTRACT

A method of forming a local interconnect contact opening is described. A liner layer is formed on a substrate having a gate structure, a first source/drain region, and a second source/drain region formed thereon. A planarized dielectric layer is formed over the liner layer. A photoresist layer, which defines the location of the local interconnect contact opening, is formed over the dielectric layer. A one-step etching process is performed using a $C_5F_8/CO/O_2/Ar$ etching gas and the liner layer as an etching stop. The dielectric layer exposed by the opening of the photoresist layer is removed to expose the liner layer. The liner layer and the photoresist layer are removed.

6 Claims, 2 Drawing Sheets

METHOD OF FORMING A LOCAL INTERCONNECT CONTACT OPENING

CROSS-REFERENCE TO RELATED APPLICATION

This application claims the priority benefit of Taiwan application serial no. 89119722, filed Sep. 25, 2000.

BACKGROUND OF THE INVENTION

1. Field of the Invention

The present invention relates to a semiconductor fabrication method. More particularly, the present invention relates to a method of fabricating a local interconnect contact opening.

2. Description of the Related Art

After the metal-oxide semiconductor (MOS) transistors of the integrated circuit are formed, contact plugs and metal lines are used to provide connection between MOS transistors, or between source/drain regions. Typical contact plugs and metal lines are formed by first forming a MOS transistor and then forming a dielectric layer over the substrate. Thereafter, a contact opening is formed in the dielectric layer by a photolithographic and etching process. A metal layer is formed over the dielectric layer to fill the contact opening. A photolithographic and etching process is performed to pattern the metal layer. A fabrication process of forming a contact plug and a metal line is thus completed.

When design rules becomes more complex, because of the limitation of the photolithographic technique, it is difficult to simultaneously form a dense distribution of contact openings in a dielectric layer. In order to overcome this difficulty, the current method uses one single contact instead of using the contact nodes having an equal electrical potential. This method is described as follows. A dielectric layer is formed over the substrate. A photolithographic and etching process is performed. A local interconnect contact opening exposing both gate and the source/drain region of the gate is formed in the dielectric layer. In addition, a share contact opening, which exposes both the gate and a source/drain region on one side of the gate, is formed in the dielectric layer, simultaneously. Thereafter, a conductive material is filled in the local interconnect contact opening and the share contact opening. A local interconnect contact and a share contact are thus formed.

The above-described method increases the fabrication window of the photolithographic process. However, the opening size difference among the local interconnection contact opening, the share contact opening, and the contact openings that only exposes the source/drain region are great. This, in turn, induces microloading effect. In addition, because the dielectric layer varies in thickness, the depths of contact openings are different. Thus, the selection of the etchant of the above method is very important. Otherwise, the micro-loading effect arising from non-uniform etching and over-etching caused by different depths of the openings will easily occur.

SUMMARY OF THE INVENTION

The invention provides a method of forming a local interconnect contact opening. A liner layer is formed on a substrate having a gate structure, a first source/drain region, and a second source/drain region formed thereon. A planarized dielectric layer is formed over the liner layer. A photoresist layer, which defines the location of the local interconnect contact opening, is formed over the dielectric layer. A one-step etching process is performed using a $C_5F_8/CO/O_2/Ar$ etching gas and the liner layer as an etching stop. The dielectric layer exposed by the opening of the photoresist layer is removed to expose the liner layer. The liner layer and the photoresist layer are removed.

The present invention further provides a method of forming contact openings having different depths and different opening sizes. A substrate having a gate structure and source/drain region formed thereon is provided. A liner layer is formed over the substrate to cover the gate structure and the source/drain regions. A planarized dielectric layer. A photoresist layer is formed over the dielectric layer to expose locations of contact openings. A one-step etching process is performed using a $C_5F_8/CO/O_2/Ar$ etching gas and using the liner layer as an etching stop to etch the dielectric layer exposed by the photoresist layer. After the etching process is performed, a local interconnect contact opening, a share contact opening, and a borderless opening are formed to expose the liner layer. Both the local interconnect opening and the share contact opening and the share contact opening have a first depth and a second depth. An opening size of the local interconnect opening is larger than an opening size of the share contact opening. An opening size of the share contact opening is larger that an opening size of the borderless opening. Portions of the liner layer exposed by the local interconnect opening, the share contact opening, the borderless contact opening are removed to expose the gate structure and the source/drain regions. The photoresist layer is removed.

In the $C_5F_8/CO/O_2/Ar$ etching gas, a $C_5F_8$ gas has a flow rate of about 9 sccm to about 16 sccm, a CO gas has a flow rate of about 50 sccm to about 250 sccm, an $O_2$ has has a flow rate of about 7 sccm to about 12 sccm, and an Ar gas has a flow rate of about 300 sccm to about 600 sccm.

In the present invention, the etching receipt has a high etching selectivity between the dielectric layer and the liner layer. When the dielectric layer is continuously etched to form deeper contact openings, the exposed liner layer can resist etching. Thus, no etched-through problem occurs. In this manner, the invention can performs a longer over-etching in order to prevent insufficient etching. In addition, the etching process is a one-step etching process. The etching is stop at the liner layer. Thereafter, the liner layer is removed. Thus, the fabrication of contact openings having different depths and different opening size is completed without changing the etching receipt in order to prevent the etched-though problem.

The present invention uses the $C_5F_8/CO/O_2/Ar$ etching gas to perform one-step etching process on the dielectric layer. Thus, contact openings having different depths and different opening sizes are formed. The etching uniformity is increased and the micro-loading effect is prevented.

Moreover, the present invention has a high etching selectivity between the photoresist layer and the silicon oxide layer. Thus, the thickness of the photoresist layer can be reduced. The exposure window is increased.

Furthermore, the present invention employs the one-step etching process using the $C_5F_8/CO/O_2/Ar$ etching gas. Thus, the present invention is not affected by the thickness of the dielectric layer. Therefore, with respect to the dielectric layer, the fabrication window of the present invention is increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
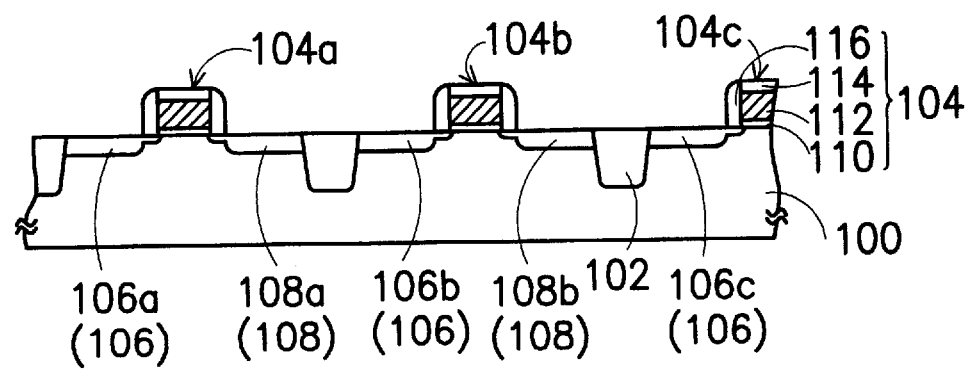
FIGS. 1A through 1E are schematic, cross-sectional views illustrating a method of forming contact openings having different depths and different opening sizes according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are schematic, cross-sectional views illustrating a method of forming contact openings having different depths and different opening sizes according to one preferred embodiment of the invention.

As shown in FIG. 1A, a substrate 100 is provided. The material for the substrate 100 is silicon, for example. An isolation region 102 is formed on the substrate 100 to define active region. The isolation region 102 can be, for example, shallow trench isolation (STI) or local oxidation of silicon (LOCOS). Thereafter, a plurality of devices, such as gate structures 104 and source/drain regions 106 and 108, is formed on the substrate 100. Typically, each gate structure 104 has a stacked structure including a gate oxide layer 110, a polysilicon gate layer 112, and a silicide layer 114 and has a spacer 116 formed on a sidewall of the stacked structure. Gate structures 104 are individually referenced as gate structures 104a, 104b, and 104c and are differentiated according to location. The source/drain regions 106 are individually referenced as source/drain regions 106a, 106b, and 106c and are differentiated according to location. In addition, the source/drain regions are individually referenced as source/drain regions 108a, 108b, and 108c are differentiated according to location.

The gate structures 104 can be formed by the following exemplary steps. An oxide layer 110 is formed on the substrate 100 by, for example, thermal oxidation. A polysilicon layer 112 is formed over the oxide layer 110 by low-pressure chemical vapor deposition (LPCVD). Thereafter, a silicide layer 114 is formed over the polysilicon layer 112 by physical vapor deposition. The material for the silicide layer 114 includes titanium silicide, and tungsten silicide. A photolithographic and etching is performed to pattern the oxide layer 110, the polysilicon layer 112, and the silicide layer 114 to form a plurality of stacked structures. A spacer material layer (not shown) is formed over the substrate 100. An anisotropic etching process is performed to form spacers 116 on the sidewalls of the stacked structure. In addition, the source/drain regions 106 and 108 can be formed by, for example, performing an ion implantation. Impurities are implanted in the substrate 100. Thereafter, an annealing process is performed to form the source/drain regions 106 and 108.

Figure 1B:
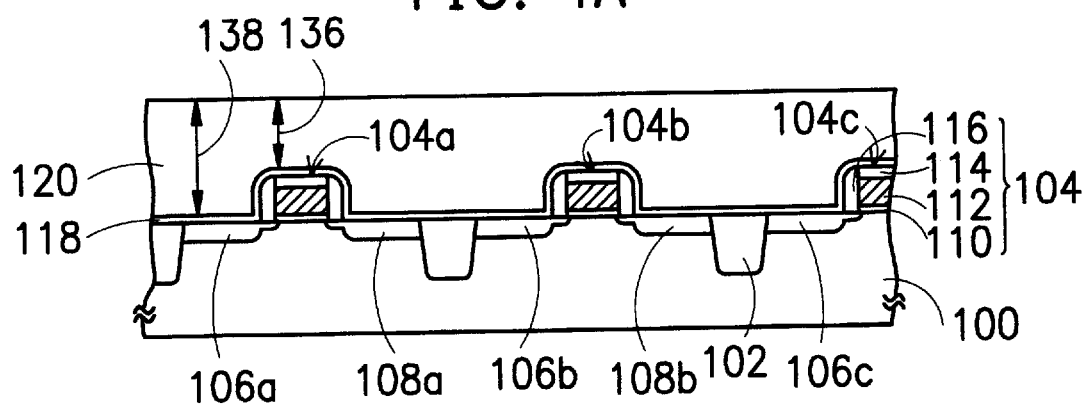

As shown in FIG. 1B, a liner layer 118 is formed over the substrate 100. A dielectric layer 120 is formed over the liner layer 118. The etching rate of the liner layer 118 is different from the etching rate of the dielectric layer 120. The dielectric layer 120 typically is, for example, chemical vapor deposited silicon oxide or borophosphosilicate glass (BPSG) layer. The preferred material for liner layer 118 is chemical vapor deposited silicon nitride or silicon oxy-nitride or other material having similar properties. After the dielectric layer 120 is formed, a chemical mechanical polishing process is performed to planarize the dielectric layer 120. There are at least two different depths, such as depth 136 and depth 138, between the planarized dielectric layer 120 and the liner layer 118.

Figure 1C:
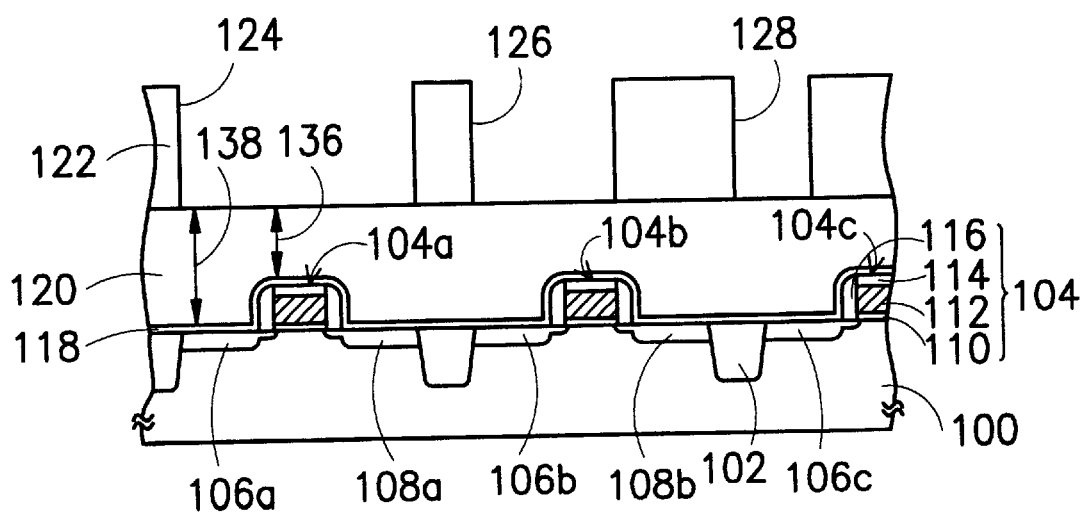

As shown in FIG. 1C, a photoresist layer 122 is formed over the dielectric layer 120. The photoresist layer 122 has openings 124, 126, and 128 that expose portions of the dielectric layer 120 for forming the contacts. The opening 124 exposes the dielectric layer 120 above the gate structure 104a and the adjacent source/drain regions 106a and 108a. The opening 126 exposes the dielectric layer 120 above the gate structure 104b and the adjacent source/drain region 106b. The opening 128 exposes the dielectric layer 120 above the source/drain region 106c.

Figure 1D:
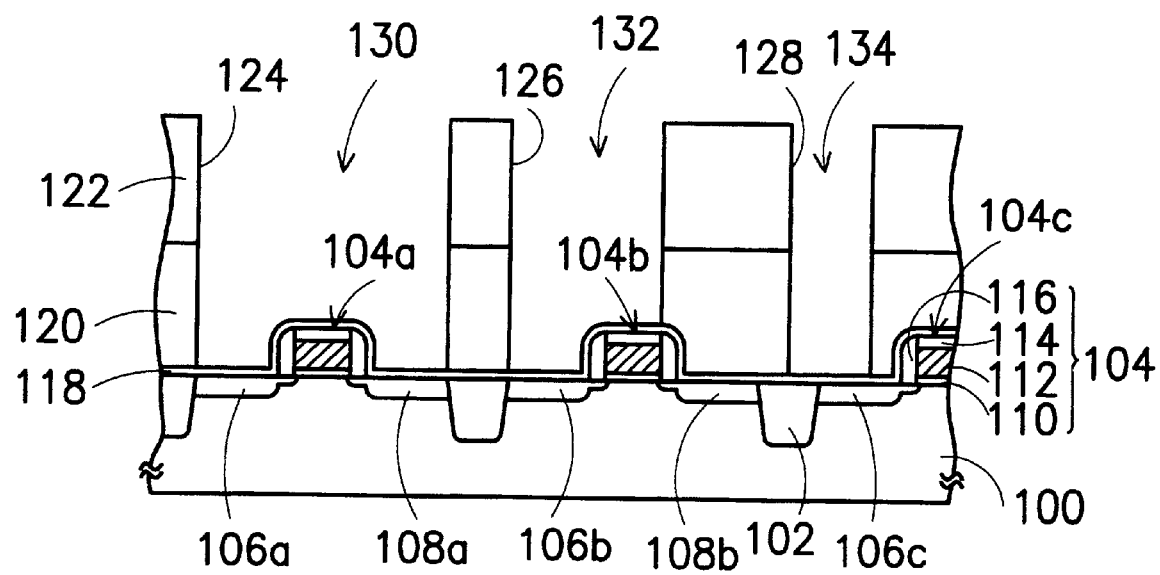

As shown in FIG. 1D, using the photoresist layer 122 as an etching mask, a one-step etching process is performed with a $C_5F_8/CO/O_2/Ar$ etching gas and the liner layer 118 serving as an etching stop layer. The dielectric layer 120 exposes by the openings 124, 126, and 128 of the photoresist layer 120 are etched simultaneously. A local interconnect contact opening 130, a share contact opening 132, and a borderless contact opening 134 are formed. The local interconnect opening 130 exposes the liner layer 118 above the gate structure 104a and the adjacent source/drain regions 106a and 108a. The common node opening 132 exposes the liner layer 118 above the gate structure 104b and the adjacent source/drain region 106b. The borderless contact opening 134 exposes the liner layer 118 above the source/drain region 106c. In addition, the opening size of the local interconnect contact opening 130 is larger than the opening size of the share contact opening 132. The opening size of the share contact opening 132 is larger than the opening size of the borderless contact opening 134.

The $C_5F_8$ gas of the $C_5F_8/CO/O_2/Ar$ etching gas has a flow rate of about 9 sccm to 16 sccm. The CO gas of the $C_5F_8/CO/O_2/Ar$ etching gas has a flow rate of about 50 sccm to about 250 sccm. The $O_2$ gas of the $C_5F_8/CO/O_2/Ar$ etching gas has a flow rate of about 7 sccm to about 12 sccm. The Ar gas of the $C_5F_8/CO/O_2/Ar$ etching gas has a flow rate of about 300 sccm to about 600 sccm. The etching gas has a high etching selectivity between the liner layer 118 and the dielectric layer 120. In addition, the etching gas has a high etching selectivity between the photoresist layer 122 and the dielectric layer 120.

The etching gas has a high etching selectivity between the liner layer 118 and the dielectric layer 120. When the dielectric layer 120 is etched to a depth 136, the liner layer 118 above the gate structures 104a and 104b are exposed. The etching step is continuously performed to form the deeper contact opening 130, 132 and 134 in the dielectric layer 120. The exposed liner layer 118 can resist etching, so that problems resulting from the liner layer 118 being etched though do not occur. Therefore, it is not necessary to reduce the amount of oxygen at the ending stage of the etching, in order to increase the etching selectivity between the dielectric layer 120 and the liner layer 118, for example, to increase the etching selectivity between silicon oxide and the silicon nitride. The present invention employs the one-step etching process using the liner layer 118 as an etching stop. Thus, over-etching can be performed in order to prevent insufficient etching. After the dielectric layer 120 is removed by etching, the liner layer 118 is removed. The contact opening 130, 132, and 134 having different opening sizes and different depths are formed. It is unnecessary to change the etching receipt of the etching gas during the etching in order to prevent etched-through problem.

Figure 1E:
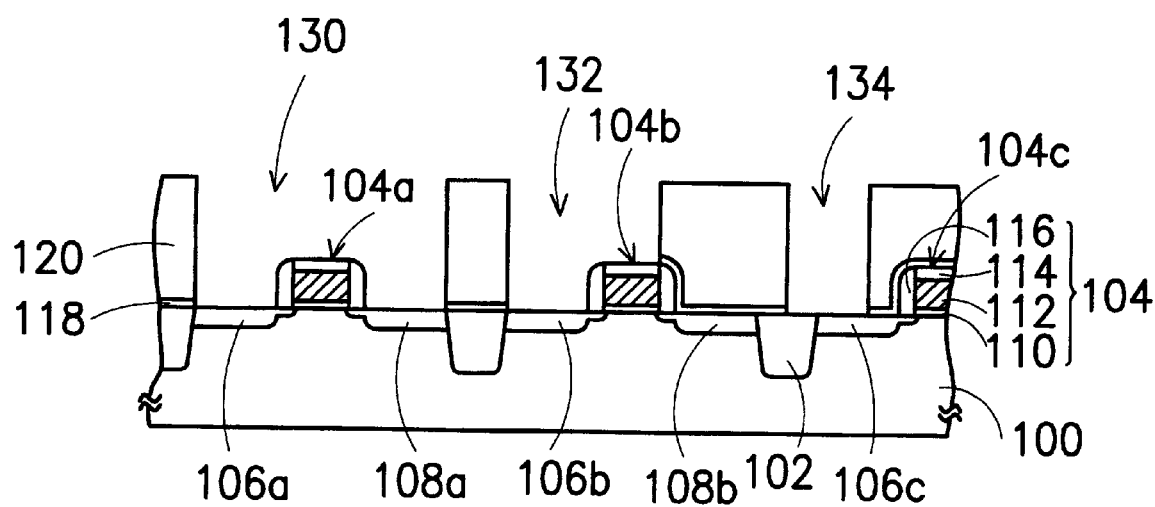

As shown in FIG. 1E, the liner layer 118 exposed by the local interconnect opening 130, the share contact opening 132, and the borderless opening 134 is removed. The gate structure 104a, the source/drain regions 106a and 108a, the gate structure 104b, and the source/drain region 106b, and the source/drain region 106c are exposed. The liner layer 118 is removed by, for example, anisotropic etching. The photoresist layer 124 is removed in order to complete the fabrication process.

Accordingly, the present invention includes at least the following advantages:

1. In the present invention, the etching gas has a high etching selectivity between the dielectric layer and the liner layer. Thus, the liner layer exposed by the dielectric layer will not be etched-through while etching the dielectric layer.
2. During the etching process for forming the contact openings in the dielectric layer, the flow rate of each gas of the $C_5F_8/CO/O_2/Ar$ etching gas is fixed. The etching process is a one-step etching process. That is, the etching receipt of the etching process is fixed. The fabrication process thus is simplified.
3. The present invention uses the $C_5F_8/CO/O_2/Ar$ etching gas to perform one-step etching process on the dielectric layer. Thus, contact openings having different depths and different opening sizes are formed. The etching uniformity is increased and the micro-loading effect is prevented.
4. The present invention has a high etching selectivity between the photoresist layer and the silicon oxide layer. Thus, the thickness of the photoresist layer can be reduced. The exposure window is increased.
5. The present invention employs the one-step etching process using the $C_5F_8/CO/O_2/Ar$ etching gas. Thus, the present invention is not affected by the thickness of the dielectric layer. Therefore, with respect to the dielectric layer, the fabrication window of the present invention is increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of forming contact openings having different depths and different opening sizes, comprising:

providing a substrate, wherein a plurality of devices is formed on the substrate;

forming a liner layer to cover the devices;

forming a dielectric layer at least having a first depth and a second depth over the liner layer;

forming a photoresist layer over the dielectric layer to expose locations of contact openings;

performing a one-step etching process using a $C_5F_8/CO/O_2/Ar$ etching gas and using the liner layer as an etching stop to etch the dielectric layer exposed by the photoresist layer, wherein after the etching process, a local interconnect contact opening, a share contact opening, and a borderless opening are formed to expose the liner layer, both the local interconnect opening and the share contact opening have a first depth and a second depth, an opening size of the local interconnect opening is larger than an opening size of the share contact opening, and an opening size of the share contact opening is larger than an opening size of the borderless opening;

removing the liner layer exposed by the local interconnect opening, the share contact opening, the borderless contact opening to exposes the devices; and removing the photoresist layer.

2. The method of claim 1, wherein a $C_5F_8$ gas of the $C_5F_8/CO/O_2/Ar$ etching gas has a flow rate of about 9 sccm to about 16 sccm.

3. The method of claim 1, wherein a CO gas of the $C_5F_8/CO/O_2/Ar$ etching gas has a flow rate of about 50 sccm to about 250 sccm.

4. The method of claim 1, wherein an $O_2$ gas of the $C_5F_8/CO/O_2/Ar$ etching gas has a flow rate of about 7 sccm to about 12 sccm.

5. The method of claim 1, wherein an Ar gas of the $C_5F_8/CO/O_2/Ar$ etching gas has a flow rate of about 300 sccm to about 600 sccm.

6. The method of claim 1, wherein in the $C_5F_8/CO/O_2/Ar$ etching gas, a $C_5F_8$ gas has a flow rate of about 9 sccm to about 16 sccm, a CO gas has a flow rate of about 50 sccm to about 250 sccm, an $O_2$ has has a flow rate of about 7 sccm to about 12 sccm, and an Ar gas has a flow rate of about 300 sccm to about 600 sccm.

* * * * *